(12) United States Patent
Jung et al.

(10) Patent No.: US 7,755,964 B2
(45) Date of Patent: Jul. 13, 2010

(54) MEMORY DEVICE WITH CONFIGURABLE DELAY TRACKING

(75) Inventors: Seong-Ook Jung, San Diego, CA (US); Sei Seung Yoon, San Diego, CA (US); Yi Han, San Jose, CA (US)

(73) Assignee: QUALCOMM Incorporated

( * ) Notice: Subject to any disclaimer, the term of this patent is extended or adjusted under 35 U.S.C. 154(b) by 328 days.

(21) Appl. No.: 11/552,893

(22) Filed: Oct. 25, 2006

(65) Prior Publication Data

US 2008/0101143 A1 May 1, 2008

(51) Int. Cl.
*G11C 7/02* (2006.01)
(52) U.S. Cl. ............................. 365/210.1; 365/210.12; 365/194; 365/205; 365/207; 365/185.2; 365/185.21; 365/154; 365/233.1
(58) Field of Classification Search ............... 365/210.1, 365/210.12, 194, 205, 207, 185.2, 185.21, 365/154, 233.1
See application file for complete search history.

(56) References Cited

U.S. PATENT DOCUMENTS

| | | | | |
|---|---|---|---|---|
| 5,384,737 | A * | 1/1995 | Childs et al. ........... | 365/189.05 |
| 6,172,925 | B1 * | 1/2001 | Bloker .................... | 365/210.12 |
| 6,282,131 | B1 * | 8/2001 | Roy ........................... | 365/191 |
| 6,646,938 | B2 * | 11/2003 | Kodama ................ | 365/210.14 |
| 6,717,877 | B2 * | 4/2004 | Suzuki et al. .......... | 365/210.12 |
| 7,082,048 | B2 * | 7/2006 | Choi ........................... | 365/149 |
| 7,359,272 | B2 * | 4/2008 | Wang et al. ................ | 365/226 |
| 2002/0163843 | A1 * | 11/2002 | Sim et al. .................... | 365/204 |
| 2004/0027852 | A1 | 2/2004 | Watanabe | |
| 2004/0095800 | A1 | 5/2004 | Lin et al. | |
| 2004/0202039 | A1 * | 10/2004 | Takayanagi ................. | 365/233 |
| 2006/0239094 | A1 | 10/2006 | Maki | |
| 2007/0280022 | A1 * | 12/2007 | Nguyen et al. .............. | 365/210 |
| 2008/0037338 | A1 * | 2/2008 | Chen et al. ................... | 365/194 |

FOREIGN PATENT DOCUMENTS

WO       2005052944       6/2005

OTHER PUBLICATIONS

International Search Report—PCT/US07/082555, International Search Authority—European Patent Office—Mar. 18, 2008.
Written Opinion—PCT/US07/082555, International Search Authority—European Patent Office—Mar. 18, 2008.

* cited by examiner

*Primary Examiner*—Anh Phung
*Assistant Examiner*—Eric Wendler
(74) *Attorney, Agent, or Firm*—Nicholas J. Pauley; Sam Talpalatsky; Peter Kamarchik

(57) ABSTRACT

A memory device with configurable delay tracking is described. The memory device includes M normal word line drivers, a dummy word line driver a memory array, N sense amplifiers, and a timing control circuit. The memory array includes M rows and N columns of memory cells and a column of dummy cells. The word line drivers drive word lines for the rows of memory cells. The dummy word line driver drives a dummy word line for at least one dummy cell in the column of dummy cells. The timing control circuit generates enable signals having configurable delay, which may be obtained with an acceleration circuit that provides variable drive for a dummy bit line coupled to the column of memory cells. The sense amplifiers detect bit lines for the columns of memory cells based on the enable signals.

23 Claims, 10 Drawing Sheets

MEMORY DEVICE WITH CONFIGURABLE DELAY TRACKING

BACKGROUND

I. Field

The present disclosure relates generally to electronics, and more specifically to a memory device.

II. Background

Memory devices are commonly used in many electronics devices such as computers, wireless communication devices, personal digital assistants (PDAs), etc. A memory device typically includes many rows and columns of memory cells. Each memory cell may be loaded with a data value, which may be a binary "0" or "1". To read a given memory cell in a given row and column, a word line for the row is activated, and the memory cell either charges or discharges a bit line for the column depending on the data value stored in the memory cell. A sense amplifier detects the voltage on the bit line and provides a logic value based on the detected voltage.

The sense amplifier should be turned on as early as possible and for a minimum amount of time in order to achieve high operating speed and low power consumption. The sense amplifier may be activated after the bit line has been sufficiently charged or discharged so that the data value stored in the memory cell can be reliably detected. This charge/discharge time is dependent on transistor characteristics and parasitic effects, which may vary widely due to integrated circuit (IC) process, temperature, and power supply variations. Process variation is more severe as IC fabrication technology improves and transistor size shrinks. The amount of time allocated for charging and discharging the bit line may be selected based on the worst-case process variation in order to ensure that the bit line is sufficiently charged or discharged prior to sensing. However, designing for the worst-case process variation may reduce operating speed and/or increase power consumption.

There is therefore a need in the art for a memory device that can efficiently account for process and other variations.

SUMMARY

A memory device with configurable delay tracking and capable of accounting for process and other variations is described herein. In one design, the memory device includes multiple (M) normal word line drivers, a dummy word line driver, a memory array, multiple (N) sense amplifiers, and a timing control circuit, The memory array comprises M rows and N columns of memory cells and a column of dummy cells. The M word line drivers drive M word lines for the M rows of memory cells. The dummy word line driver drives a dummy word line for at least one dummy cell in the column of dummy cells.

The timing control circuit generates enable signals for the sense amplifiers. The timing control circuit may include an acceleration circuit and sense amplifier drivers. The acceleration circuit may couple to a dummy bit line for the column of dummy cells and provide variable drive for the dummy bit line. The acceleration circuit may include multiple transistors that are selectable to provide variable drive for the dummy bit line. The sense amplifier drivers may receive a ready signal from the acceleration circuit and generate the enable signals having configurable delay determined by the variable drive for the dummy bit line. The sense amplifiers couple to bit lines for the columns of memory cells and detect the bit lines based on the enable signals.

The dummy word line driver may be matched in delay to the word line drivers. The loading on the dummy word line may be matched to the loading on each normal word line, and the loading on the dummy bit line may be matched to the loading on each normal bit line. The timing control circuit may account for (a) delay variations between the dummy and normal word line drivers, the dummy and normal word lines, and the dummy and normal bit lines and (b) additional delay due to additional circuitry used to generate the enable signals.

Various aspects and features of the disclosure are described in further detail below.

DETAILED DESCRIPTION

A memory device with configurable delay tracking is described herein. The memory device may be a random access memory (RAM), a static RAM (SRAM), a dynamic RAM (DRAM), a synchronous DRAM (SDRAM), a video RAM (VRAM), a synchronous graphic RAM (SGRAM), a read only memory (ROM), a Flash memory, etc. The memory device may be a stand-alone device or may be embedded within another device, e.g., a processor.

Figure 1:
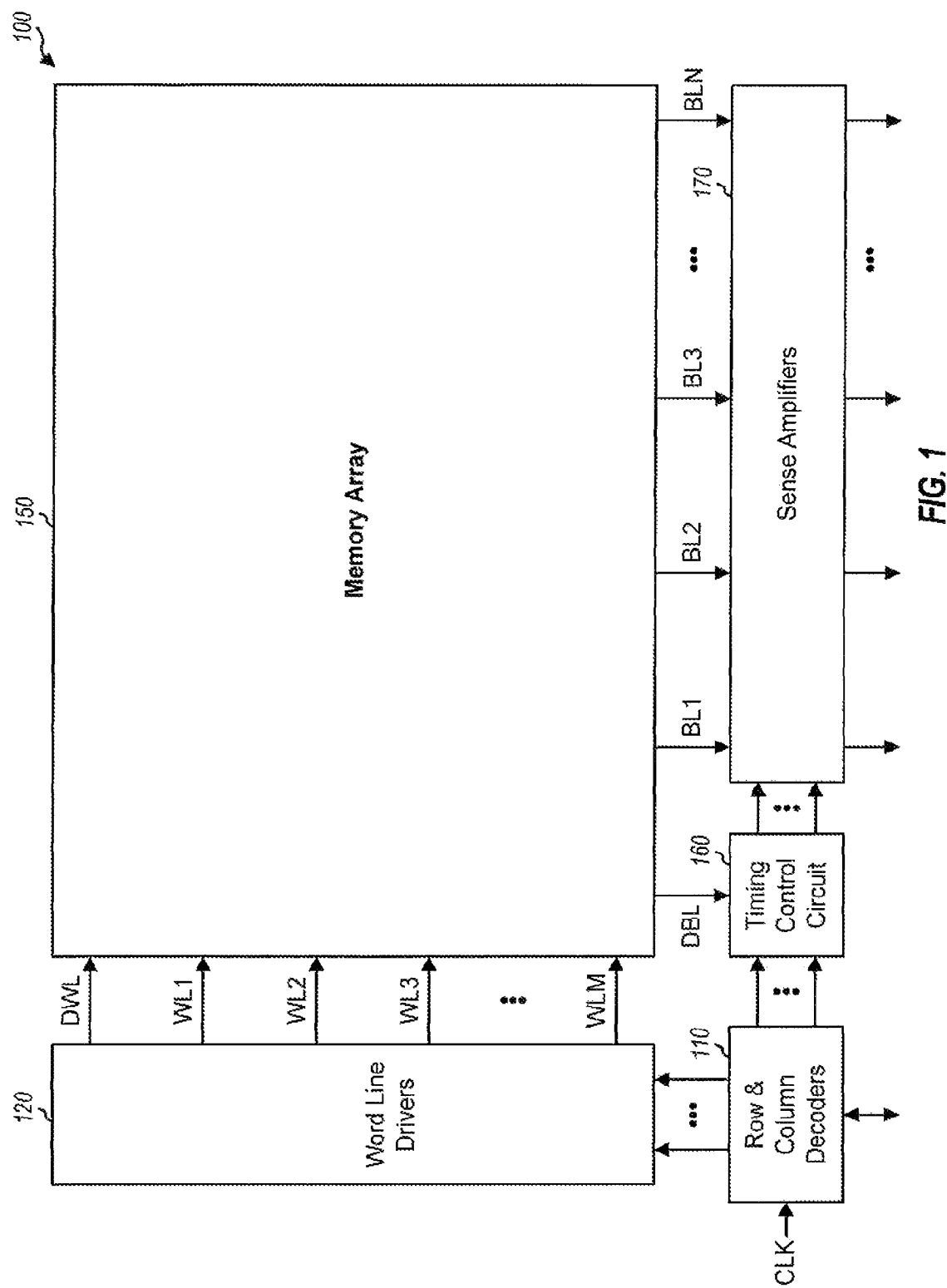
FIG. 1 shows a block diagram of a memory device with configurable delay tracking.

FIG. 1 shows a block diagram of a design of a memory device 100 with configurable delay tracking. Memory device 100 includes row and column decoders 110, word line drivers 120, a memory array 150, a timing control unit 160, and sense amplifiers 170.

Memory array 150 includes M rows and N columns of memory cells and further includes one row and one column of dummy cells, as described below. A memory cell is a circuit that can store a data value and may be implemented with various circuit designs. A dummy cell is a circuit that can store a known value and/or is connected in a particular manner to achieve a desired loading offset. A dummy cell may be implemented with the same or similar circuit design as a memory cell. In general, M and N may each be any value. The M rows of memory cells are selected via M word lines WL1 through WLM, and the row of dummy cells is selected via dummy word line DWL. The N columns of memory cells are coupled to N bit lines BL1 through BLN, and the column of dummy cells is coupled to a dummy bit line DBL. The memory cells and dummy cells are typically implemented with differential design, and each cell typically couples to a differential bit line BL and $\overline{BL}$. For simplicity, the complementary bit lines $\overline{BL1}$ through $\overline{BLN}$ for the N columns are omitted in many of the figures.

Row and columns decoders 110 receive an address for a memory cell or a block of memory cells to be accessed and generate a row address and a column address based on the received address. Decoders 110 then perform pre-decoding on the row address and provide pre-decoded signals that indicate a specific word line to assert based on the row address. Decoders 110 also perform pre-decoding on the column address and provide select signals that indicate one or more specific bit lines to select based on the column address. Decoders 110 also receive a clock signal CLK and generate internal clocks and command signals used to control the operation of memory device 100.

Word line drivers 120 receive the pre-decoded signals from decoders 110 and drive a specific word line indicated by the pre-decoded signals so that the desired row of memory cells can be accessed. Timing control circuit 160 receives the select signals from decoders 110 and generates enable signals for N sense amplifiers 170 for the N bit lines. Timing control circuit 160 asserts the enable signal for each selected bit line so that the memory cell coupled to that bit line can be accessed. The enable signals have configurable delay determined by the column of dummy cells and timing control circuit 160, as described below.

Sense amplifiers 170 couple to bit lines BL1 through BLN, one sense amplifier for each bit line. Each sense amplifier receives a respective enable signal from timing control circuit 160. Each sense amplifier, when selected by the enable signal, amplifies the voltage on the associated bit line, detects a logic value (e.g., low or high) for the amplified voltage, and provides the detected logic value.

Figure 2:
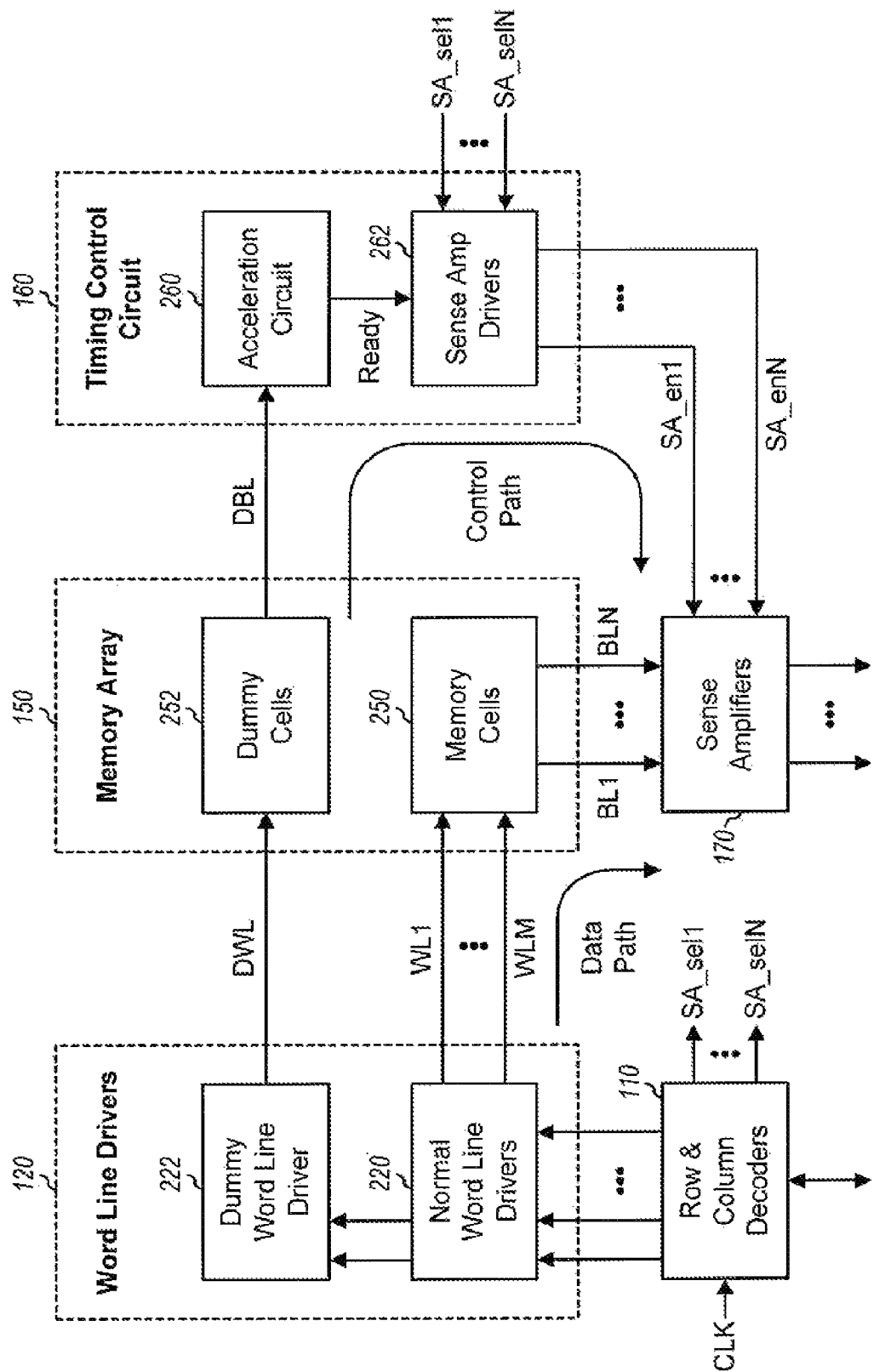
FIG. 2 shows a block diagram of word line drivers, a memory array, and a timing control circuit within the memory device.

FIG. 2 shows a block diagram of a design of word line drivers 120, memory array 150, and timing control circuit 160 in FIG. 1. Word line drivers 120 include normal word line drivers 220 and a dummy word line driver 222. Normal word line drivers 220 receive the pre-decoded signals from decoders 110 and drive a selected word line indicated by the pre-decoded signals. Dummy word line driver 222 receives one or more pre-decoded signals and drives the dummy word line DWL. Word line drivers 220 and 222 may be designed such that the signal on the dummy word line is approximately time aligned with the signal on the selected word line.

Memory array 150 includes memory cells 250 and dummy cells 252, which are described below. Memory cells 250 are selected by the M word lines WL1 through WLM and charge/discharge the N bit lines BL1 through BLN. Dummy cells 252 are selected by the dummy word line DWL and discharge the dummy bit line DBL.

Timing control circuit 160 includes an acceleration circuit 260 and sense amplifier drivers 262. Acceleration circuit 260 provides variable drive for the dummy bit line and outputs a Ready signal from circuit 260 and the select signals SA_sel1 through SA_selN from decoders 110 and generate the enable signals SA_en1 through SA_enN for sense amplifiers 170. For each read operation, drivers 262 assert one or more enable signals that activate one or more sense amplifiers for one or more bit lines to be read.

Figure 3:
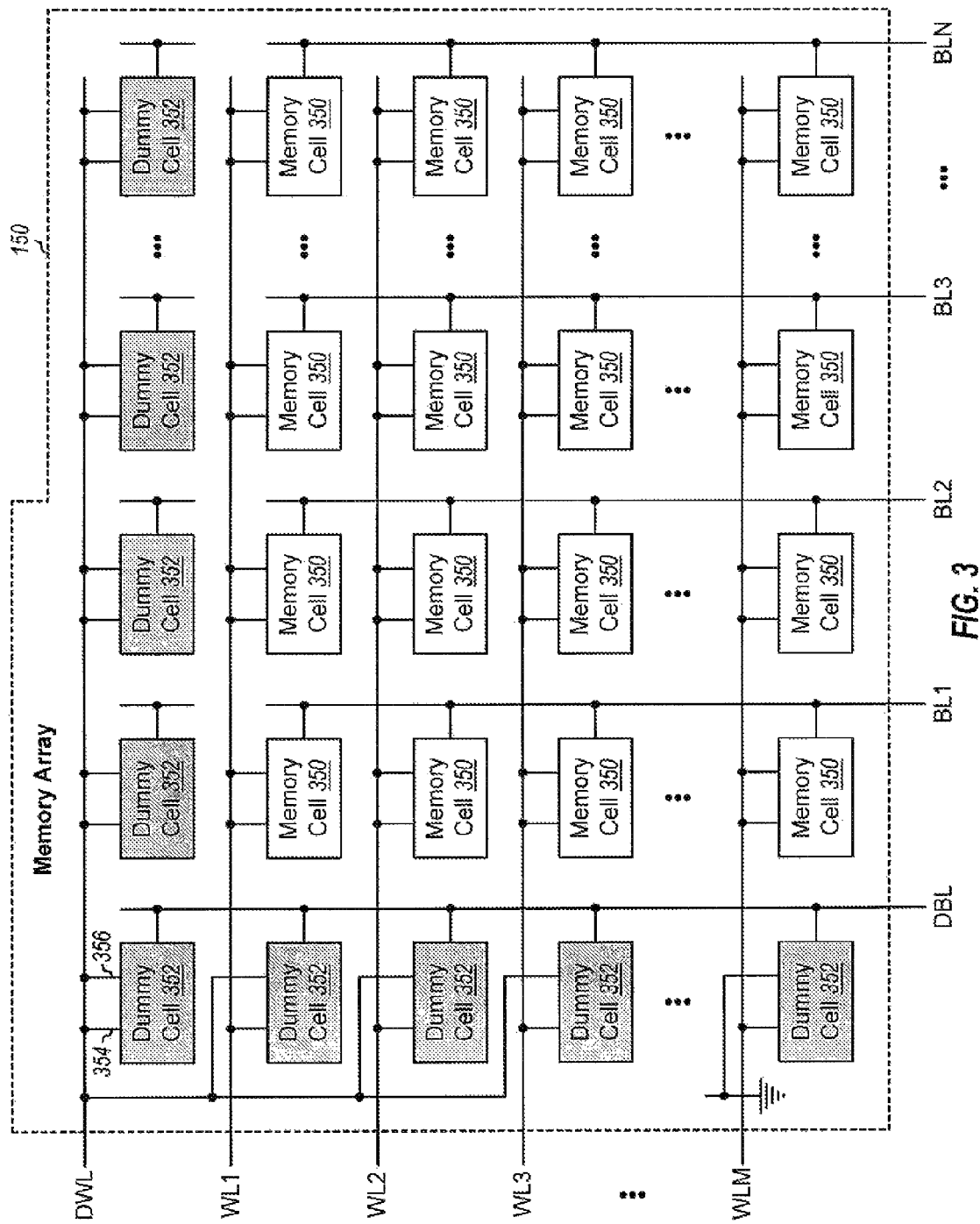
FIG. 3 shows a block diagram of the memory array.

FIG. 3 shows a block diagram of a design of memory array 150. In this design, memory array 150 includes M+1 rows and N+1 columns of cells—one row and one column of dummy cells 352 and M rows and N columns of memory cells 350. The row of dummy cells (or dummy row) receives the dummy word line, and each remaining row of cells receives a respective word line. The column of dummy cells (or dummy column) couples to the dummy bit line, and each column of memory cells couples to a respective bit line. Each memory cell may store a data value. Each dummy cell may store a predetermined value, e.g., logic low.

The dummy row may include the same number of dummy cells as the number of cells in each normal row. The loading on the dummy word line may then be similar to the loading on each normal word line. The first dummy cell in the dummy row couples to the dummy bit line, and the remaining dummy cells in the dummy row are not coupled to any bit line.

The dummy column may include the same number of dummy cells as the number of cells in each normal column. Each memory cell and each dummy cell has a left WL input 354 and a right WL input 356 used to select that cell. For clarity, WL inputs 354 and 356 are labeled for only the upper left dummy cell but are present in all cells. In the design shown in FIG. 3, the top four dummy cells in the dummy column have their right WL inputs coupled to the dummy word line, and the remaining dummy cells in the dummy column have their right WL inputs tied to circuit ground. Each dummy cell in the dummy column has its left WL input coupled to a respective dummy or normal word line. The loading on the dummy word line may then be similar to the loading on each normal word line.

One word line is asserted for a memory read. The asserted word line enables all of the memory cells coupled to that word line. The enabled memory cells charge or discharge the bit lines coupled to these memory cells. One or more bit lines may be selected for the memory read. The sense amplifiers detect the voltage on the selected bit line(s) and provide the corresponding logic value(s).

The dummy word line and dummy bit line are also asserted for a memory read. The dummy word line enables the top four dummy cells in the dummy column, which then discharge the dummy bit line. Timing control circuit 160 detects the voltage on the dummy bit line and generates the enable signals for the sense amplifiers.

Figures 4A, 4B:
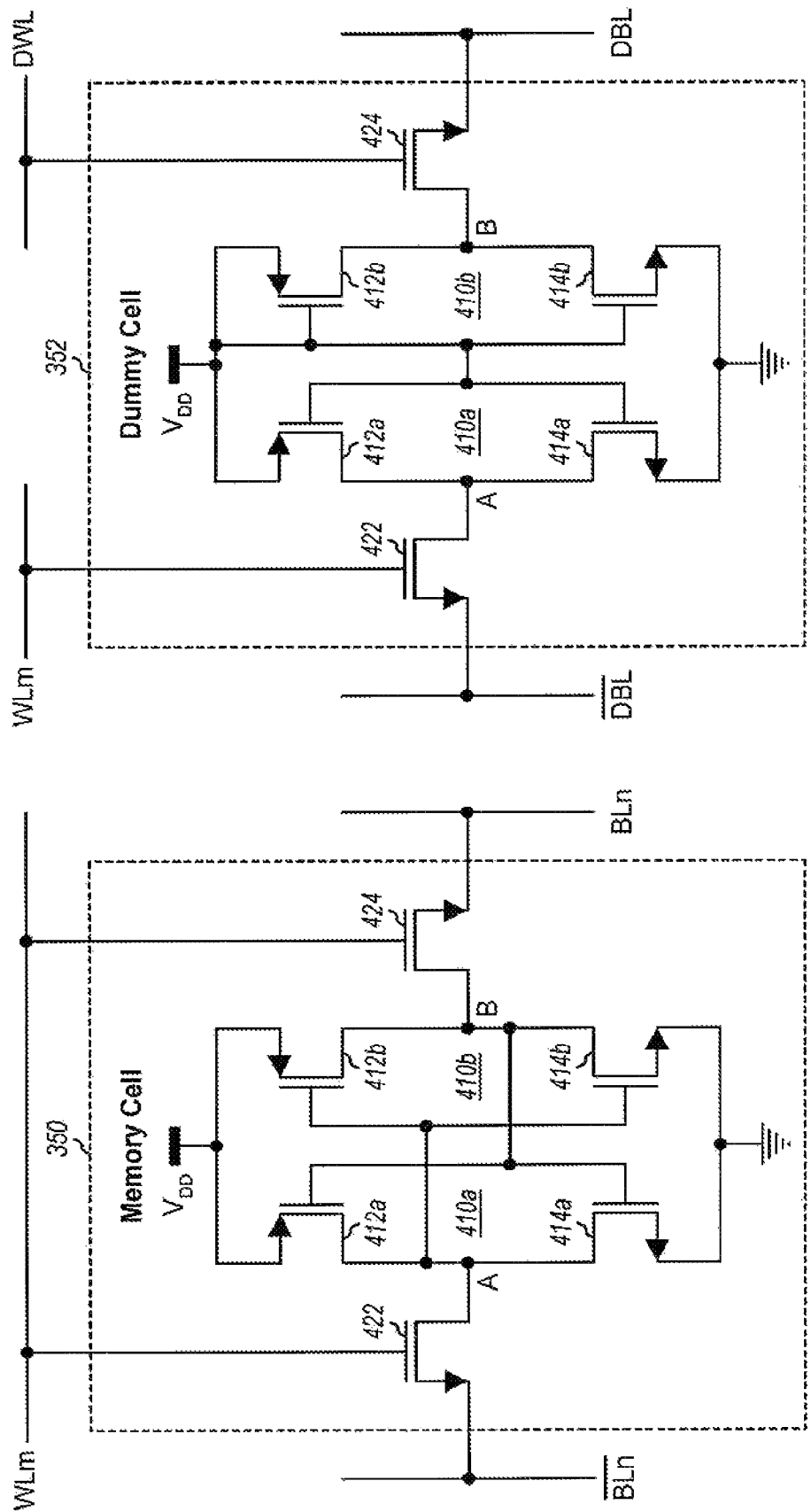
FIG. 4A shows a schematic diagram of a memory cell.
FIG. 4B shows a schematic diagram of a dummy cell.

FIG. 4A shows a schematic diagram of one memory cell 350 in FIG. 3. Memory cell 350 includes a pair of cross-coupled inverters 410a and 410b and a pair of pass transistors 422 and 424. Each inverter 410 is formed by a P-channel field effect transistor (P-FET) 412 and an N-channel field effect transistor (N-FET) 414. FETs 412 and 414 have their drains coupled together, their gates also coupled together, and their sources coupled to a power supply $V_{DD}$ and circuit ground, respectively. The output of inverter 410a (formed by the drains of FETs 412a and 414a and labeled as node A) couples to the input of inverter 410b (formed by the gates of FETs 412b and 414b). The output of inverter 410b (formed by the drains of FETs 412b and 414b and labeled as node B) couples to the input of inverter 410a (formed by the gates of FETs 412a and 414a). N-FET 422 has its drain coupled to node A, its gate coupled to a word line WLm, and its source coupled to a complementary bit line $\overline{BLn}$. N-FET 424 has its drain coupled to node B, its gate coupled to word line WLm, and its source coupled to a bit line BLn.

Inverters 410a and 410b store a data value via positive feedback. When memory cell 350 stores logic high ('1'), node B is at logic high and node A is at logic low. When memory cell 350 stores logic low ('0'), node B is at logic low and node A is at logic high. For a memory read, word line WLm is asserted to logic high, and N-FETs 422 and 424 are turned on. If memory cell 350 stores logic high, then bit line BLn is charged via N-FET 424 and complementary bit line $\overline{BLn}$ is discharged via N-FET 422. The converse is true when memory cell 350 stores logic low.

FIG. 4B shows a schematic diagram of one dummy cell 352 in FIG. 3. Dummy cell 352 includes inverters 410a and 410b and N-FETs 422 and 424 that are coupled as described above for FIG. 4A, with the following differences. The inputs of inverters 410a and 410b are couple to $V_{DD}$, and the outputs of inverters 410a and 410b (nodes A and B) are at logic low. N-FET 422 has its gate coupled to word line WLm and its source coupled to a complementary dummy bit line $\overline{DBL}$. N-FET 424 has its gate coupled to either the dummy word line DWL (as shown in FIG. 4B) or circuit ground (not shown) and its source coupled to the dummy bit line DBL.

For a memory read, if the dummy word line is coupled to the gate of N-FET 424 and is asserted to logic high, then N-FET 424 is turned on and discharges the dummy bit line DBL. If the gate of N-FET 424 is connected to circuit ground (not shown in FIG. 4B), then N-FET 424 is turned off all the time and does not discharge the dummy bit line.

In the design shown in FIG. 3, the top four dummy cells in the dummy column may store a predetermined value, e.g., logic low as shown in FIB. 4B. The dummy word line is coupled to the right WL inputs of the top four dummy cells and enables these dummy cells for each memory read. The right WL inputs of the remaining dummy cells in the dummy column are coupled to circuit ground, and these dummy cells are disabled all the time. The dummy bit line is thus driven by four dummy cells in this design. In general, any number of dummy cells may be enabled to drive the dummy bit line. The remaining dummy cells in the dummy column are used to match the loading on the dummy bit line with the loading on each normal bit line.

Referring back to FIG. 2, the data path for a memory read includes normal word line drivers 220, word lines WL1 and WLM, memory cells 250, and bit line BL1 through BLN. The control path includes dummy word line driver 222, the dummy word line DWL, dummy cells 252, the dummy bit line DBL, and timing control circuit 160. The delay of the control path should match the delay of the data parts to achieve fast operating speed and low power consumption. This delay matching may be achieved as described below.

Decoders 110 in FIG. 1 perform pre-decoding of the row address and generate pre-decoded signals. As an example, memory array 150 may include 64 rows, and each row may be identified by a 6-bit row address $b_5b_4b_3b_2b_1b_0$, where $b_5$ is the most significant bit (MSB) and $b_0$ is the least significant bit (LSB). Decoders 110 may organize the 6-bit row address into a 3-bit upper segment containing the three most significant bits $b_5b_4b_3$, a 2-bit middle segment containing the next two most significant bits $b_2b_1$, and a 1-bit lower segment containing the least significant bit $b_0$. Decoders 110 may decode the 1-bit lower segment into two pre-decoded signals A0 and A1 that select one of two possible word lines in a pair. Decoders 110 may provide the next two more significant bits $b_1$ and $b_2$ as two pre-decoded signals B0 and B1 that select one of four word line pairs in a group. Decoders 110 may decode the 3-bit upper segment into eight pre-decoded signals that select one of eight word line groups, with each group including four word line pairs. Decoders 110 may then provide the 12 pre-decoded signals to word line drivers 120. Decoders 110 may also perform pre-decoding in various other manners.

Figure 5:
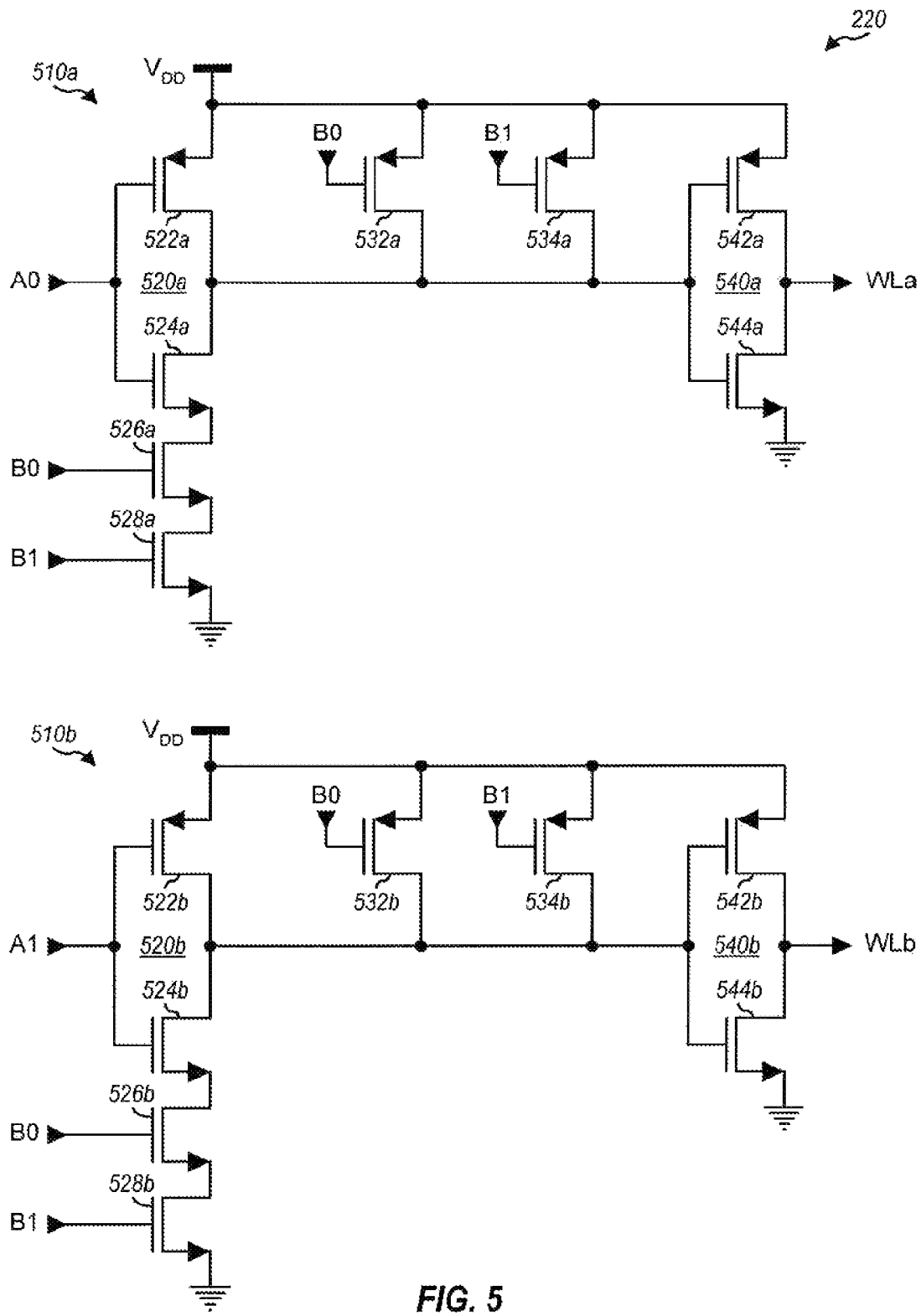
FIG. 5 shows a schematic diagram of two normal word line drivers.

FIG. 5 shows a schematic diagram of a design of normal word line drivers 220 in FIG. 2. For simplicity, FIG. 5 shows driver circuits 510a and 510b for only two word lines WLa and WLb, respectively, which are two of the M word lines WL1 through WLM in FIGS. 1 to 3.

Driver circuit 510a includes transistors 522a through 544a. P-FET 522a and N-FET 524a are coupled as an inverter 520a and are further stacked on top of N-FETs 526a and 528a. N-FET 526a has its drain coupled to the source of N-FET 524a and its gate receiving the B0 signal. N-FET 528a has its drain coupled to the source of N-FET 526a, its gate receiving the B1 signal, and is source coupled to circuit ground. P-FET 542a and N-FET 544a are also coupled as an inverter 540a and have their input coupled to the output of inverter 520a. P-FETs 532a and 534b are pull-up transistors and have their sources coupled to $V_{DD}$, their drains coupled to the input of inverter 540a, and their gates receiving the B0 and B1 signals, respectively. Driver circuit 510a implements a 3-input AND gate that receives the A0, B0 and B1 signals and drives word line WLa.

Driver circuit 510a is enabled when the B0 and B1 signals are at logic high. When the B0 signal is at logic low, N-FET 526a is turned off, P-FET 532a is turned on and pulls up the input of inverter 540a, and word line WLa is forced to logic low. Similarly, when the B1 signal is at logic low, N-FET 528a is turned off, P-FET 534a is turned on and pulls up the input of inverter 540a, and word line WLa is also forced to logic low. When the B0 and B1 signals are at logic high, N-FETs 526a and 528a are turned on, P-FETs 532a and 534a are turned off, inverters 520a and 540 are coupled in series, and word line WLa is a delayed version of the A0 signal.

Driver circuit 510b for word line WLb includes transistors 522b through 544b that are coupled in the same manner as transistors 522a through 544a, except that the input of inverter 520b receives the A1 signal instead of the A0 signal. Driver circuit 510b is also enabled when the B0 and B1 signals are at logic high, in which case word line WLb is a delayed version of the A1 signal.

Figure 6:
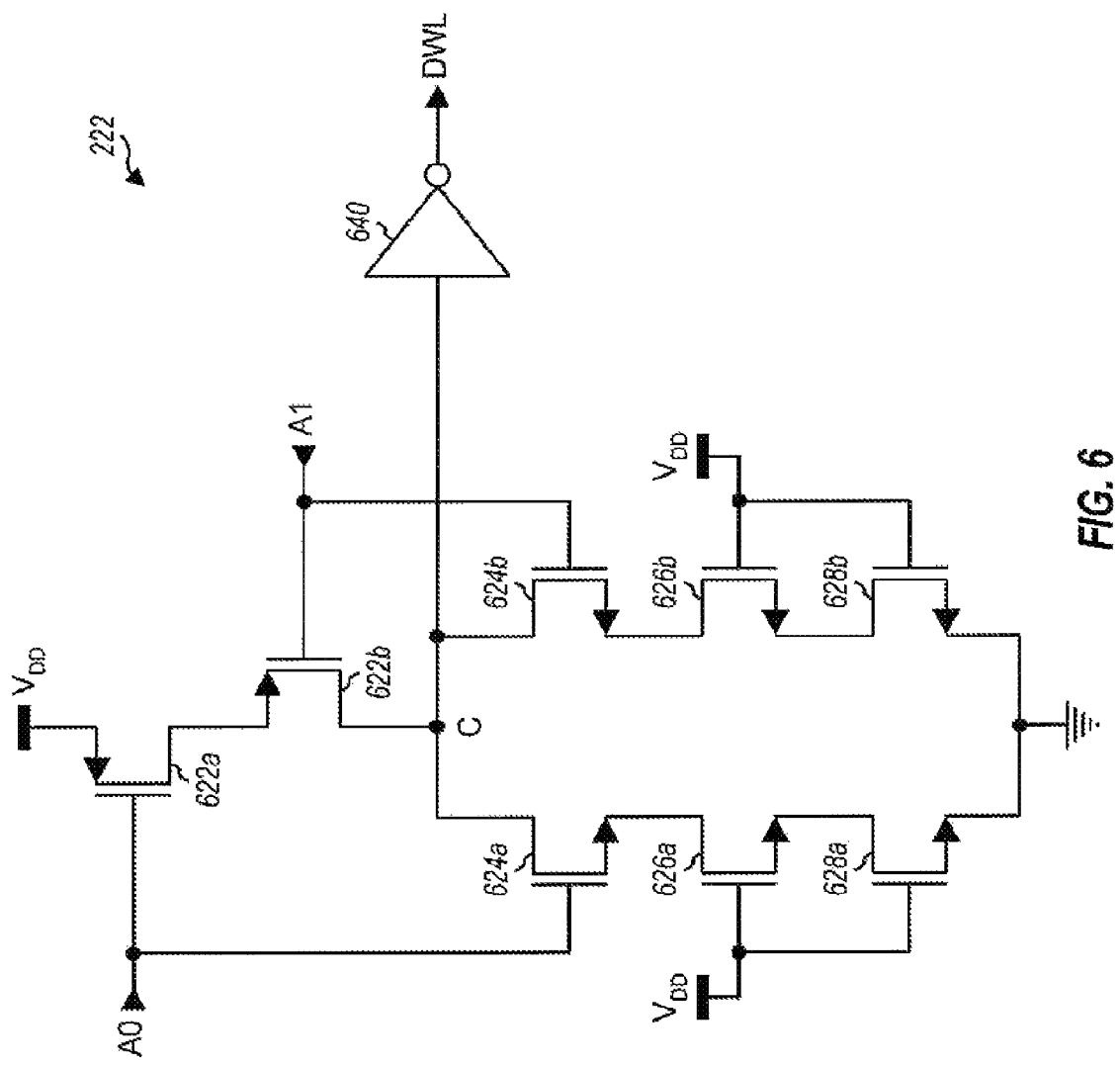
FIG. 6 shows a schematic diagram of a dummy word line driver.

FIG. 6 shows a schematic diagram of a design of dummy word line driver 222 in FIG. 2. Driver 222 includes P-FETs 622a and 622b stacked together. P-FET 622a has its source coupled to $V_{DD}$, its gate receiving the A0 signal, and its drain coupled to the source of P-FET 622b. P-FET 622b has its gate receiving the A1 signal and its drain coupled to node C. N-FETs 624a, 626a and 628a are also stacked together. N-FET 624a has its drain coupled to the source of P-FET 524a and its gate tied to $V_{DD}$. N-FET 626a has its drain coupled to the source of P-FET 624a and its gate tied to $V_{DD}$. N-FET 628a has its drain coupled to the source of P-FET 626a, its gate tied to $V_{DD}$, and its source coupled to circuit ground. N-FETs 624b, 626b and 628b are also stacked together and coupled between node C and circuit ground in the same manner as N-FETs 624a, 626a and 628a. An inverter 640 has its input coupled to node C and its output driving the dummy word line DWL.

Prior to a memory read, the bit lines are precharged to logic high, and the A0 and A1 signals are set to logic low. P-FETs 622a and 622b are turned on and pull node C to logic high. For the memory read, either the A0 or A1 signal is activated and set to logic high, and the other signal is deactivated. N-FET 624a is turned on and pulls node C to logic low if the A0 signal is activated. N-FET 624b on and pulls node C to logic low if the A1 signal is activated. P-FET 622a and N-FETs 624a, 626a and 628a are matched to, and mimic the loading of, P-FET 522a and N-FETs 524a, 526a and 528a for driver 510a in FIG. 5. P-FET 622b and N-FETs 624b, 626b and 628a are matched to, and mimic the loading of, P-FET 522b and N-FETs 524b, 526b and 528b for driver 510b in FIG. 5. N-FETs 524a, 526a and 528a are three stacked transistors that are turned on when driver 510a is selected. N-FETs 624a, 626a and 628a are three stacked transistors that are turned on when driver 510a is selected and match the stacked N-FETs 524a, 526a and 528a. Similarly, N-FETs 624b, 626b and 628b match N-FETs 540a or 540b in FIG. 5. The delay of dummy word line driver 222 is thus matched to the delay of driver circuit 510 for one word line in FIG. 5. This results in the signal on the dummy word line being approximately time aligned with the signal on the normal word line for a memory read.

Figure 7:
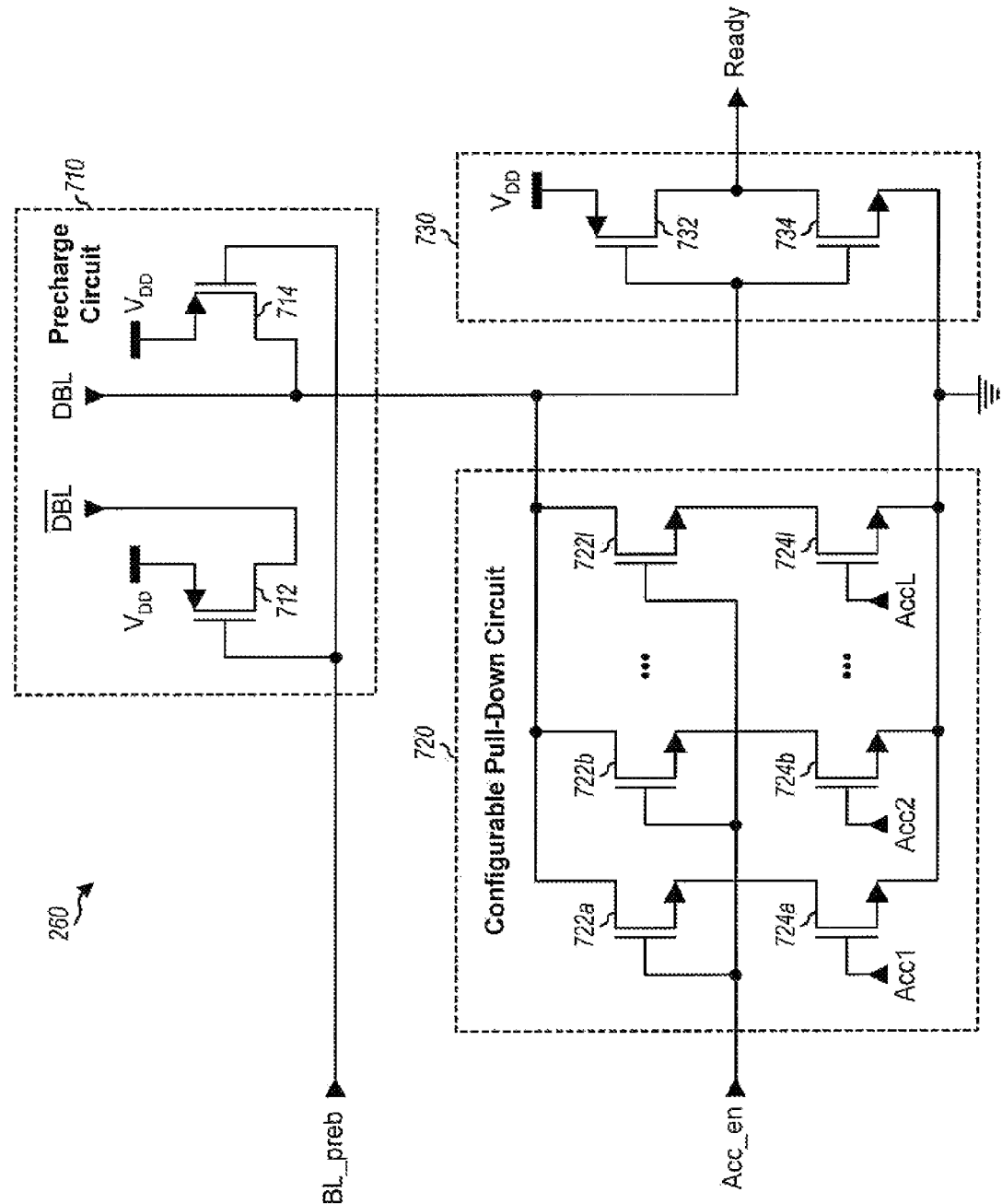
FIG. 7 shows a schematic diagram of an acceleration circuit.

FIG. 7 shows a schematic diagram of a design of acceleration circuit 260 within timing control circuit 160 in FIG. 2. Acceleration circuit 260 includes a precharge circuit 710, a configurable pull-down circuit 720, and an inverting buffer 730.

Precharge circuit 710 includes P-FETs 712 and 714. P-FET 712 has its source coupled to $V_{DD}$, its gate receiving a bit line precharge signal BL_preb, and its drain coupled to the complementary dummy bit line $\overline{DBL}$. P-FET 714 has its source coupled to $V_{DD}$, its gate receiving the precharge signal, and its drain coupled to the dummy bit line DBL. Prior to a memory read, the precharge signal is set to logic low, and P-FETs 712 and 714 are turned on and pull $\overline{DBL}$ and DBL to logic high.

Pull-down circuit 720 includes L pairs of stacked N-FETs 722a and 724a through 722l and 724l, where L may be any value. For each stacked pair, N-FET 722 has its drain coupled to the dummy bit line and its gate receiving an accelerator enable signal Acc_en. N-FET 724 has its drain coupled to the source of N-FET 722, its gate receiving an accelerator select signal Acc, and its source coupled to circuit ground.

N-FETs 722a through 722l receive the same accelerator enable signal that may be set to logic high to enable pull-down circuit 720 or to logic low to disable the pull-down circuit, N-FETs 724a through 724l receive L accelerator select signals Acc1 through AccL, respectively. Each accelerator select signal may be set to logic high to enable the associated N-FET pair or to logic low to disable the N-FET pair. Each N-FET pair that is enabled provides additional pull-down and hence speeds up the discharge time for the dummy bit line. The dimensions of the N-FETs determines the pull-down capability. The L pairs of N-FETs may have (a) the same dimension for thermometer decoding, (b) different dimensions for binary decoding, or (c) a combination of thermometer and binary decoding, e.g., thermometer decoding for a predetermined number of LSBs and binary decoding for the remaining MSBs.

Inverting buffer 730 includes P-FET 732 and N-FET 734 that are coupled as an inverter. Buffer 730 has its input coupled to the dummy bit line and its output providing the Ready signal to sense amplifier drivers 262 in FIG. 2.

Figure 8:
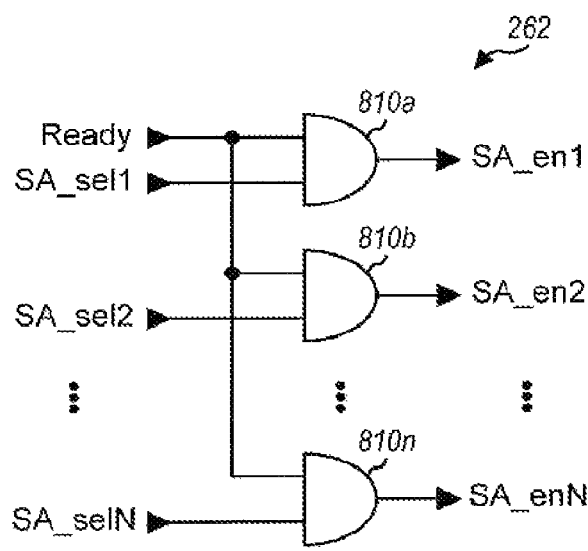
FIG. 8 shows a schematic diagram of sense amplifier drivers.

FIG. 8 shows a schematic diagram of a design of sense amplifier drivers 262 within timing control circuit 160 in FIG. 2. In this design, drivers 262 include N 2-input AND gates 810a through 810n for the N sense amplifiers 170 for the N bit lines. Each AND gate 810 receives the Ready signal from acceleration circuit 260 and a select signal SA_sel for an associated sense amplifier from decoders 110 and generates an enable signal SA_en for the associated sense amplifier. One or more sense amplifiers may be enabled by activating selected ones of the SA_en1 through SA_enN signals.

The timing of the enable signals is determined by the Ready signal. The timing of the Ready signal may be set such that the enable signals activate the sense amplifiers as early as possible while ensuring reliable detection of the voltage on the bit lines. The proper timing for the Ready signal may be determined during manufacturing, e.g., by writing a known data pattern into memory array 150 and reading the data pattern with different accelerator settings corresponding in different combinations of Acc signals being activated. The accelerator setting that provides the best performance may be saved and used for subsequent memory read operations. The timing of the Ready signal may also be set during field use.

Figure 9:
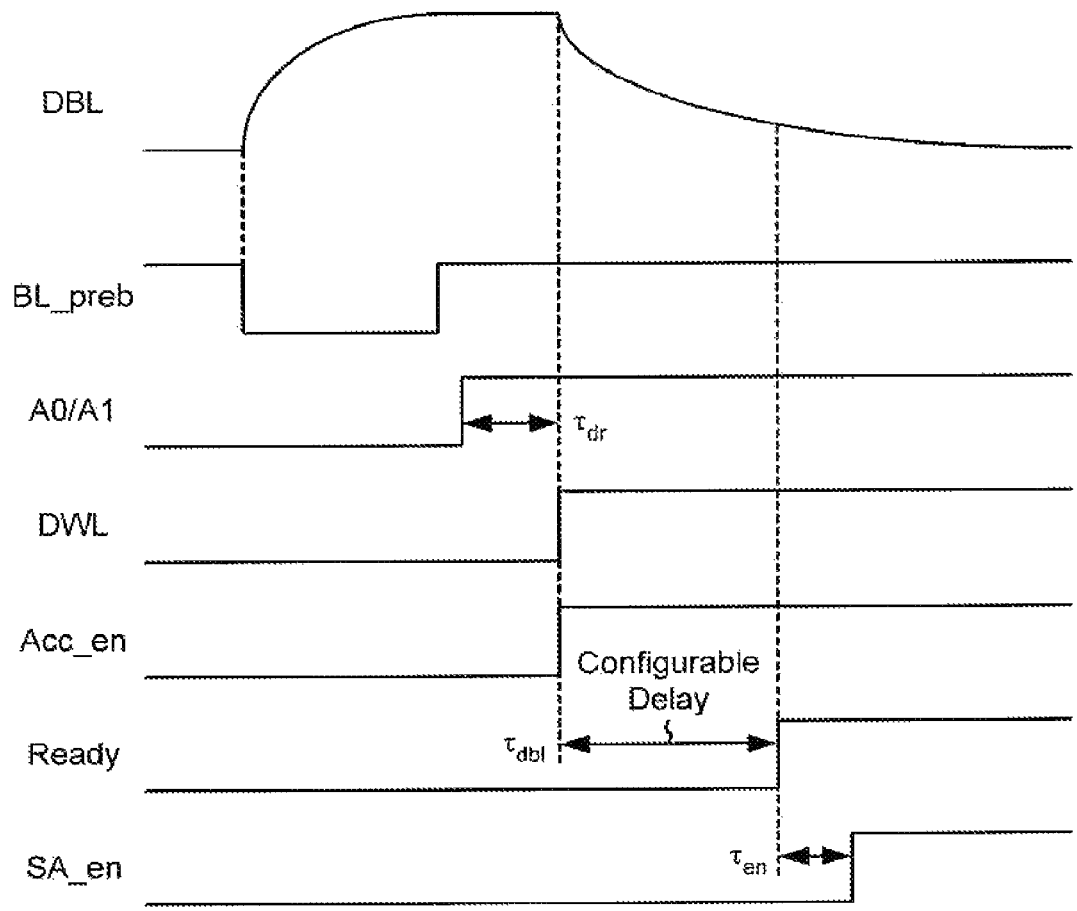
FIG. 9 shows a timing diagram for a memory read.

FIG. 9 shows a timing diagram for a memory read. The precharge signal BL_preb is initially brought to logic low to precharge the dummy bit line DBL to logic high. Either the A0 or A1 signal is then set to logic high. After a delay of $\tau_{dr}$, dummy word line driver 222 provides logic high on the dummy word line DWL. This logic high on the dummy word line selects the top four dummy cells in the dummy column in FIG. 3, which store logic low and discharge the dummy bit line DBL. Also a delay of $\tau_{dbl}$, the voltage on the dummy bit line reaches a logic low trigger voltage, and inverting buffer 730 senses logic low and provides logic high on the Ready signal. After an additional delay of $\tau_{en}$, the SA_en signal for each selected bit line transitions to logic high. The accelerator enable signal Acc_en may be aligned with the dummy word line, as shown in FIG. 9.

The total delay from A0/A1 signals to the SA_en signal is compose of (a) the delay $\tau_{dr}$ from the A0/A1 signals to the DWL, which is fixed, (b) the delay $\tau_{dbl}$ from the DWL to the Ready signal, which is configurable, and (c) the delay $\tau_{en}$ from the Ready signal to the SA_signal, which is also fixed. The delay $\tau_{dbl}$ between the DWL and the Ready signal may be varied by enabling different pairs of N-FETs 722 and 724 in pull-down circuit 720 in FIG. 7. The delay $\tau_{dbl}$ may be set such that the delay of the control path is matched to the delay of the data path.

Figure 10:
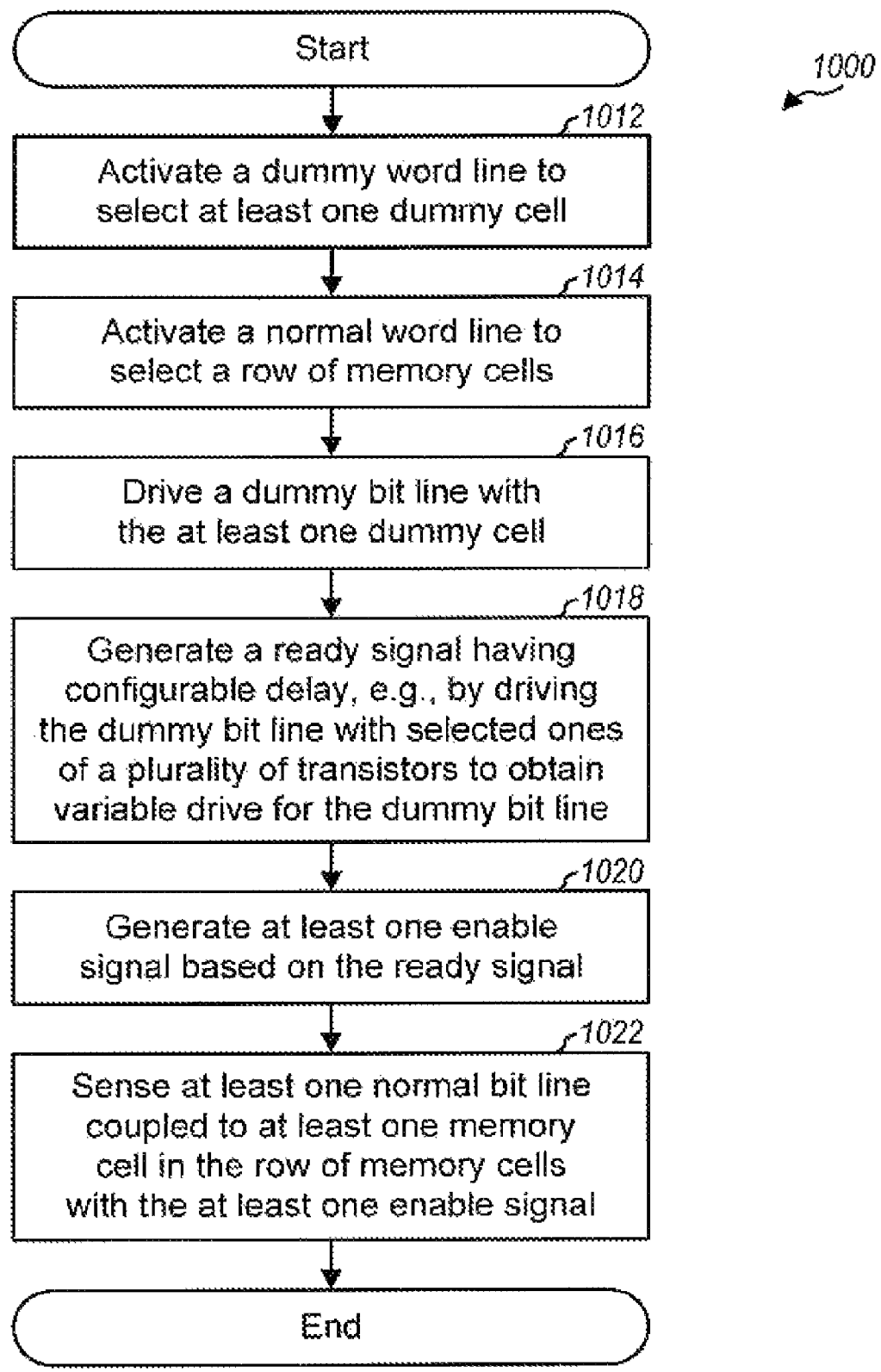
FIG. 10 shows a process for performing a memory read.

FIG. 10 shows a process 1000 for performing a memory read. A dummy word line is activated to select at least one dummy cell (block 1012). A normal word line is activated to select a row of memory cells (block 1014). A dummy bit line is driven with the at least one dummy cell (block 1016). A ready signal having configurable delay is generated based in part on the dummy bit line (block 1018). This configurable delay may be obtained, e.g., by driving the dummy bit line with selected ones of a plurality of transistors to obtain variable drive for the dummy bit line. At least one enable signal is generated based on the ready signal (block 1020). At least one normal bit line coupled to at least one memory cell in the row of memory cells is sensed with the at least one enable signal (block 1022).

As shown in FIG. 2, the control path has more circuitry than the data path. Dummy word line driver 222 may be matched to normal word line drivers 220, e.g., as described above for FIGS. 5 and 6. The loading on the dummy word line may be matched to the loading on each normal word line, and the loading on the dummy bit line may be matched to the loading on each normal bit line, e.g., as described above for FIG. 3. Sense amplifier drivers 262 result in additional delay for the control path. This delay may be accounted for by (a) using multiple (e.g., four) dummy cells to drive the dummy bit line and (b) accelerating the discharging of the dummy bit line with accelerator circuit 260. Accelerator circuit 260 can provide configurable delay that may be used to align the timing of the control path with the timing of the data path.

The delay of the data path may vary widely from memory device to memory device due to IC process variations. The delay variations may be more severe as IC fabrication technology continues to improve and transistor size continues to shrink. This is because transistors (especially those used for the memory cells) are typically designed with the smallest possible size and are thus susceptible to process variations. The matching of the dummy and normal word line drivers, the dummy and normal word lines, and the dummy and normal bit lines reduce delay variations between the control path and the data path. An integer number of dummy cells may be used to account for the delay variations as well as the additional circuitry to the control path. Accelerator circuit 260 may be used to provide fine timing adjustment. For example, if 4.5 dummy cells are needed to match the timing of the control path to the timing of the data path, then four dummy cells may be used to discharge the dummy bit line, and accelerator circuit 260 may provide drive capability corresponding to 0.5 dummy cell.

The configurable delay in the control path may be obtained by applying variable drive for the dummy word line with accelerator circuit 260. The configurable delay may also be obtained by activating different number of dummy cells to drive the dummy bit line. The configurable delay may also be obtained with a variable delay line in the control path and/or via some other means.

The memory device described herein may be used for wireless communication, computing, networking, personal electronics, etc. The memory device may be implemented in a stand-alone device or may be embedded within a processor, a digital signal processor (DSP), a reduced instruction set computer (RISC), an advanced RISC machine (ARM), a graphics processor, a graphics processing unit (GPU), a controller, a microprocessor, etc. An exemplary use of the memory device for a wireless communication device is described below.

Figure 11:
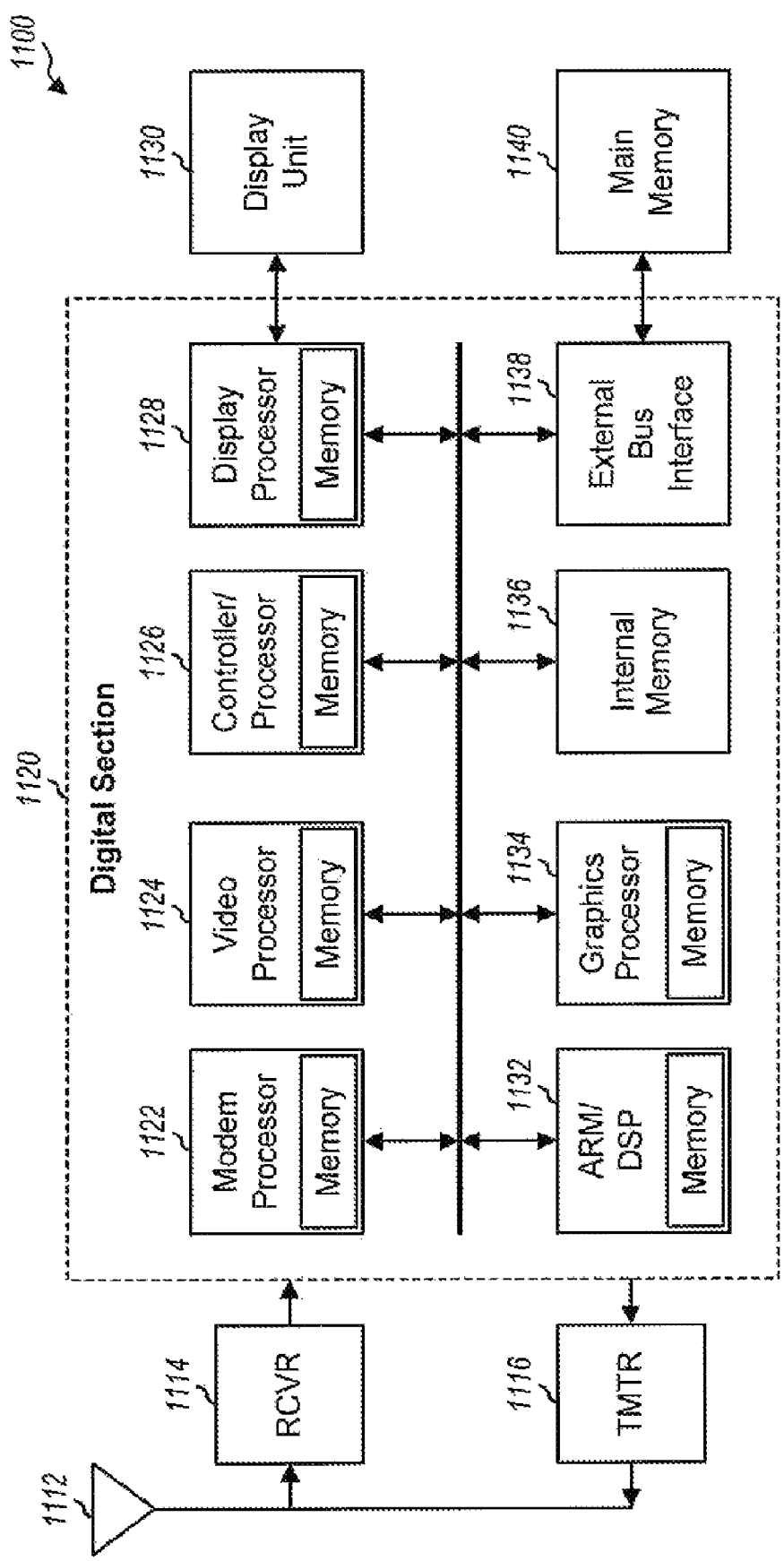
FIG. 11 shows a block diagram of a wireless communication device.

FIG. 11 shows a block diagram of a wireless device 1100 in a wireless communication system. Wireless device 1100 may be a cellular phone, a terminal, a handset, a personal digital assistant (PDA), or some other device. The wireless communication system may be a Code Division Multiple Access (CDMA) system, a Global System for Mobile Communications (GSM) system, or some other system.

Wireless device 1100 is capable of providing bi-directional communication via a receive path and a transmit path. On the receive path, signals transmitted by base stations are received by an antenna 1112 and provided to a receiver (RCVR) 1114. Receiver 1114 conditions and digitizes the received signal and provides samples to a digital section 1120 for further processing. On the transmit path, a transmitter (TMTR) 1116 receives data to be transmitted from digital section 1120, processes and conditions the data, and generates a modulated signal, which is transmitted via antenna 1112 to the base stations.

Digital section 1120 includes various processing, interface and memory units such as, for example, a modem processor 1122, a video processor 1124, a controller processor 1126, a display processor 1128, an ARM/DSP 1132, a graphics processor 1134, an internal memory 1136, and an external bus interface (EBI) 1138. Modem processor 1122 performs processing for data transmission and reception, e.g., encoding, modulation, demodulation, and decoding. Video processor 1124 performs processing on video content (e.g., still images, moving videos, and moving texts) for video applications such as camcorder, video playback, and video conferencing. Controller processor 1126 may direct the operation of various processing and interface units within digital section 1120. Display processor 1128 performs processing to facilitate the display of videos, graphics, and texts on a display unit 1130. ARM/DSP 1132 may perform graphics processing for wireless device 1100. Graphics processor 1134 performs graphics processing, e.g., for graphics, video games, etc. Internal memory 1136 stores data and/or instructions for various units within digital section 1120. EBI 1138 facilitates transfer of data between digital section 1120 (e.g., internal memory 1136) and a main memory 1140.

Each of processors 1122 through 1134 may include an embedded memory, which may be implemented as described above. Internal memory 1136 and main memory 1140 may also be implemented as described above. Digital section 1120 may be implemented with one or more application specific integrated circuit (ASICs) and/or some other type of integrated circuits (ICs).

The memory device described herein may be implemented in various hardware units such as a memory IC, an ASIC, a DSP, a digital signal processing device (DSPD), a programmable logic device (PLD), a field programmable gate array (FPGA), a controller, a processor, and other electronic devices. The memory device may also be fabricated in various IC process technologies such as CMOS, N-MOS, P-MOS, bipolar-CMOS, (Bi-CMOS), bipolar, etc. CMOS technology can fabricate both N-FETs and P-FETs on the same IC die, whereas N-MOS technology can only fabricate N-FETs and P-MOS technology can only fabricate P-FETs. The memory device may be fabricated with any device size technology, i.e., 130 nanometer (nm), 65 nm, 30 nm, etc.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples shown herein but is to be accorded the widest scope consistent with the principles and novel features disclosed herein.

What is claimed is:

1. An integrated circuit comprising:
a memory array comprising a plurality of rows and a plurality of columns of memory cells, a column of dummy cells, and a dummy word line, the dummy word line comprising at least one dummy cell;
a plurality of sense amplifiers coupled to a plurality of bit lines for the plurality of columns of memory cells; and
a timing control circuit configured to generate enable signals for the plurality of sense amplifiers, the enable signals having a configurable and selectable delay determined based in part on the column of dummy cells where the configurable and selectable delay is a fractional delay less than a delay provided by the at least one dummy cell;
a plurality of word line drivers configured to drive a plurality of word lines for the plurality of rows of memory cells; and
a dummy word line driver configured to drive the dummy word line for one or more dummy cells in the column of dummy cells, wherein the dummy word line driver is matched in delay to each of the plurality of word line drivers based on a pre-decoded signal generated by a decoder.

2. The integrated circuit of claim 1, wherein the timing control circuit comprises an acceleration circuit coupled to a dummy bit line for the column of dummy cells and configured to provide variable drive for the dummy bit line to obtain the configurable and selectable delay for the enable signals.

3. The integrated circuit of claim 1, wherein loading on the dummy word line is matched to loading on each of the plurality of word lines.

4. The integrated circuit of claim 1, wherein the memory array further comprises a row of dummy cells.

5. The integrated circuit of claim 1, wherein the memory cells and the dummy cells are implemented with equal number of transistors.

6. The integrated circuit of claim 1, wherein the column of dummy cells is coupled to a dummy bit line, and wherein a predetermined number of dummy cells is configured to drive the dummy bit line.

7. The integrated circuit of claim 1, wherein the column of dummy cells is coupled to a dummy bit line, and wherein loading on the dummy bit line is matched to loading on each of the plurality of bit lines.

8. The integrated circuit of claim 1, wherein the memory array is for a static random access memory (SRAM).

9. The apparatus of claim 1, wherein the fractional delay is produced by a pull-down circuit.

10. The integrated circuit of claim 2, wherein the acceleration circuit comprises a plurality of transistors selectable to provide the variable drive for the dummy bit line.

11. The integrated circuit of claim 2, wherein the acceleration circuit comprises a plurality of N-channel field effect transistors (N-FETs) selectable to provide variable pulldown for the dummy bit line.

12. The integrated circuit of claim 2, wherein the timing control circuit further comprises a plurality of drivers configured to receive from the acceleration circuit a ready signal having a configurable delay and to generate the enable signals based on the ready signal.

13. The integrated circuit of claim 10, wherein selected ones of the plurality of transistors are enabled to align timing of the enable signals with timing of the plurality of bit lines.

14. The integrated circuit of claim 6, wherein the dummy cells driving the dummy bit line are configured to store a predetermined logic value.

15. A memory device comprising:
a memory array comprising a plurality of rows and a plurality of columns of memory cells, a column of dummy cells, and a dummy word line, the dummy word line comprising at least one dummy cell;
a plurality of sense amplifiers coupled to a plurality of bit lines for the plurality of columns of memory cells;
a timing control circuit configured to generate enable signals for the plurality of sense amplifiers, the enable signals having a configurable delay determined based in part on the column of dummy cells where the configurable delay is a fractional delay that is less than a delay provided by the at least one dummy cell;
a plurality of word line drivers configured to drive a plurality of word lines for the plurality of rows of memory cells; and
a dummy word line driver configured to drive the dummy word line for one or more dummy cells in the column of dummy cells, wherein the dummy word line driver is matched in delay to each of the plurality of word line drivers based on a pre-decoded signal generated by a decoder.

16. The memory device of claim 15, wherein the timing control circuit comprises an acceleration circuit coupled to a dummy bit line for the column of dummy cells and configured to provide variable drive for the dummy bit line to obtain the configurable delay for the enable signals.

17. An integrated circuit comprising:
at least one word line driver configured to drive at least one word line for at least one row of memory cells wherein the at least one word line driver comprises N stacked transistors that are turned on when the at least one word line driver is enabled, where N is an integer greater than one; and
a dummy word line driver configured and selected to drive a dummy word line for at least one dummy cell, wherein the dummy word line driver is matched in delay to the at least one word line driver where the delay is less than a delay provided by the at least one dummy cell and is based on a pre-decoded signal generated by a decoder, and wherein the dummy word line driver comprises N stacked transistors to match the N stacked transistors in each word line driver.

18. A wireless device comprising:
a processor operative to perform processing for the wireless device; and
a memory device comprising a memory array comprising a plurality of rows, a plurality of columns of memory cells, a column of dummy cells, a plurality of sense amplifiers coupled to a plurality of bit lines for the plurality of columns of memory cells, and a timing control circuit configured to generate enable signals for the plurality of sense amplifiers, the enable signals having a selectable and configurable delay determined based in part on the column of dummy cells and on a pre-decoded signal generated by a decoder.

19. The wireless device of claim 18, wherein the processor and the memory device are fabricated on a single integrated circuit.

20. A method of reading a memory device, comprising:
activating a dummy word line to select at least one dummy cell;
activating a normal word line to select a row of memory cells;
driving a dummy bit line with the at least one dummy cell;
generating at least one enable signal based on the dummy bit line and having a configurable delay where the configurable delay is based on a pre-decoded signal generated by a decoder and wherein a dummy word line driver comprises N stacked transistors to match N stacked transistors in each word line driver; and
sensing at least one normal bit line coupled to at least one memory cell in the row of memory cells with the at least one enable signal.

21. The method of claim 20, further comprising:
driving the dummy bit line with selected ones of a plurality of transistors to obtain variable drive for the dummy bit line; and
generating a ready signal having a configurable delay determined by the selected ones of the plurality of transistors, and wherein the at least one enable signal is generated based on the ready signal.

22. An apparatus comprising:
means for activating a dummy word line to select at least one dummy cell;
means for activating a normal word line to select a row of memory cells;
means for driving a dummy bit line with the at least one dummy cell;
means for generating at least one enable signal based on the dummy bit line and having a configurable and selectable delay that is a fractional delay less than a delay provided by the at least one dummy cell; and
means for sensing at least one normal bit line coupled to at least one memory cell in the row of memory cells with the at least one enable signal,
wherein the means for activating a dummy word line is matched in delay to the means for activating a normal word line based on a pre-decoded signal generated by a decoder.

23. The apparatus of claim 22, further comprising:
means for driving the dummy bit line with selected ones of a plurality of transistors to obtain variable drive for the dummy bit line; and
means for generating a ready signal having a configurable delay determined by the selected ones of the plurality of transistors, and wherein the at least one enable signal is generated based on the ready signal.

* * * * *